(12) United States Patent
Chen

(10) Patent No.: US 10,054,647 B2
(45) Date of Patent: Aug. 21, 2018

(54) FAULT DETECTION

(71) Applicant: Atmel Corporation, San Jose, CA (US)

(72) Inventor: Sean S. Chen, Sunnyvale, CA (US)

(73) Assignee: Atmel Corporation, San Jose, CA (US)

( * ) Notice: Subject to any disclaimer, the term of this patent is extended or adjusted under 35 U.S.C. 154(b) by 420 days.

(21) Appl. No.: 14/486,419

(22) Filed: Sep. 15, 2014

(65) Prior Publication Data

US 2016/0077162 A1 Mar. 17, 2016

(51) Int. Cl.
| | |
|---|---|
| *G01R 31/40* | (2014.01) |
| *H02H 3/04* | (2006.01) |
| *H02H 3/44* | (2006.01) |
| *H02M 1/32* | (2007.01) |
| *H02H 7/10* | (2006.01) |
| H02M 3/156 | (2006.01) |

(52) U.S. Cl.
CPC .............. *G01R 31/40* (2013.01); *H02H 7/10* (2013.01); *H02M 1/32* (2013.01); H02M 3/156 (2013.01)

(58) Field of Classification Search
CPC .......... G01R 31/40; G01R 31/42; H02H 7/10; H02H 7/1213; H02H 7/1216; H02H 3/04; H02H 3/44; H02H 9/04; H02H 9/045; H02H 9/046; H02M 1/32
See application file for complete search history.

(56) References Cited

U.S. PATENT DOCUMENTS

| | | | |
|---|---|---|---|
| 6,246,556 B1 | 6/2001 | Haun et al. | |
| 6,373,734 B1 | 4/2002 | Martinelli | |
| 6,980,443 B2 * | 12/2005 | Nagano | H02M 3/33523 363/21.12 |
| 7,649,323 B1 | 1/2010 | Kuhlmann et al. | |
| 8,159,362 B2 | 4/2012 | Swartzendruber et al. | |
| 8,364,809 B2 | 1/2013 | Mehlhorn et al. | |
| 8,520,415 B1 * | 8/2013 | Krishnamoorthy | H02M 3/33523 363/21.07 |
| 8,581,497 B1 | 11/2013 | Xiong et al. | |
| 2007/0002510 A1 * | 1/2007 | Baurle | H02M 1/32 361/94 |

(Continued)

FOREIGN PATENT DOCUMENTS

WO   WO2013/163266   10/2013

OTHER PUBLICATIONS

'Supervisory IC for Desktop Power Supply Monitoring'[online]. ON Semiconductor, 2007. Retrieved from the Internet: <URL: http://onsemi.com>.

*Primary Examiner* — Tung X Nguyen
*Assistant Examiner* — David Frederiksen
(74) *Attorney, Agent, or Firm* — Fish & Richardson P.C.

(57) ABSTRACT

Methods, systems, and apparatus, including computer programs encoded on computer storage media, for fault detection in a power control system. In one aspect, a method includes measuring a plurality of values of a feedback voltage from a power control system over a period of time; determining a rate of feedback voltage change based on the measured values of the feedback voltage and a duration of the period of time; determining, with a controller, that the determined rate of feedback voltage change is smaller than a threshold rate of change; and in response to determining that the determined rate of feedback voltage change is smaller than the threshold rate of change, transmitting a fault indication signal to the power control system.

27 Claims, 5 Drawing Sheets

(56) References Cited

U.S. PATENT DOCUMENTS

| | | | |
|---|---|---|---|
| 2010/0066337 A1* | 3/2010 | Gong | H02M 1/4225 |
| | | | 323/285 |
| 2010/0080022 A1* | 4/2010 | Schmidt | H02M 7/062 |
| | | | 363/53 |
| 2011/0050187 A1* | 3/2011 | Lai | H02M 3/1588 |
| | | | 323/282 |
| 2011/0291585 A1* | 12/2011 | Foo | H05B 33/0815 |
| | | | 315/291 |
| 2011/0305047 A1* | 12/2011 | Jungreis | H02M 1/08 |
| | | | 363/21.02 |
| 2012/0043900 A1* | 2/2012 | Chitta | H05B 41/295 |
| | | | 315/201 |
| 2012/0176818 A1* | 7/2012 | Gati | H02M 3/33523 |
| | | | 363/21.07 |
| 2013/0140990 A1* | 6/2013 | Campos | H05B 33/0827 |
| | | | 315/120 |
| 2014/0078789 A1* | 3/2014 | Li | H02M 3/33523 |
| | | | 363/21.15 |
| 2014/0152180 A1 | 6/2014 | Wolf et al. | |
| 2014/0293665 A1* | 10/2014 | Hart | H02M 1/36 |
| | | | 363/49 |
| 2015/0062768 A1* | 3/2015 | Prescott | H02M 1/32 |
| | | | 361/86 |
| 2015/0326008 A1* | 11/2015 | Baurle | H02H 1/0084 |
| | | | 361/87 |
| 2015/0338472 A1* | 11/2015 | Nuqui | G01R 31/025 |
| | | | 324/764.01 |

* cited by examiner

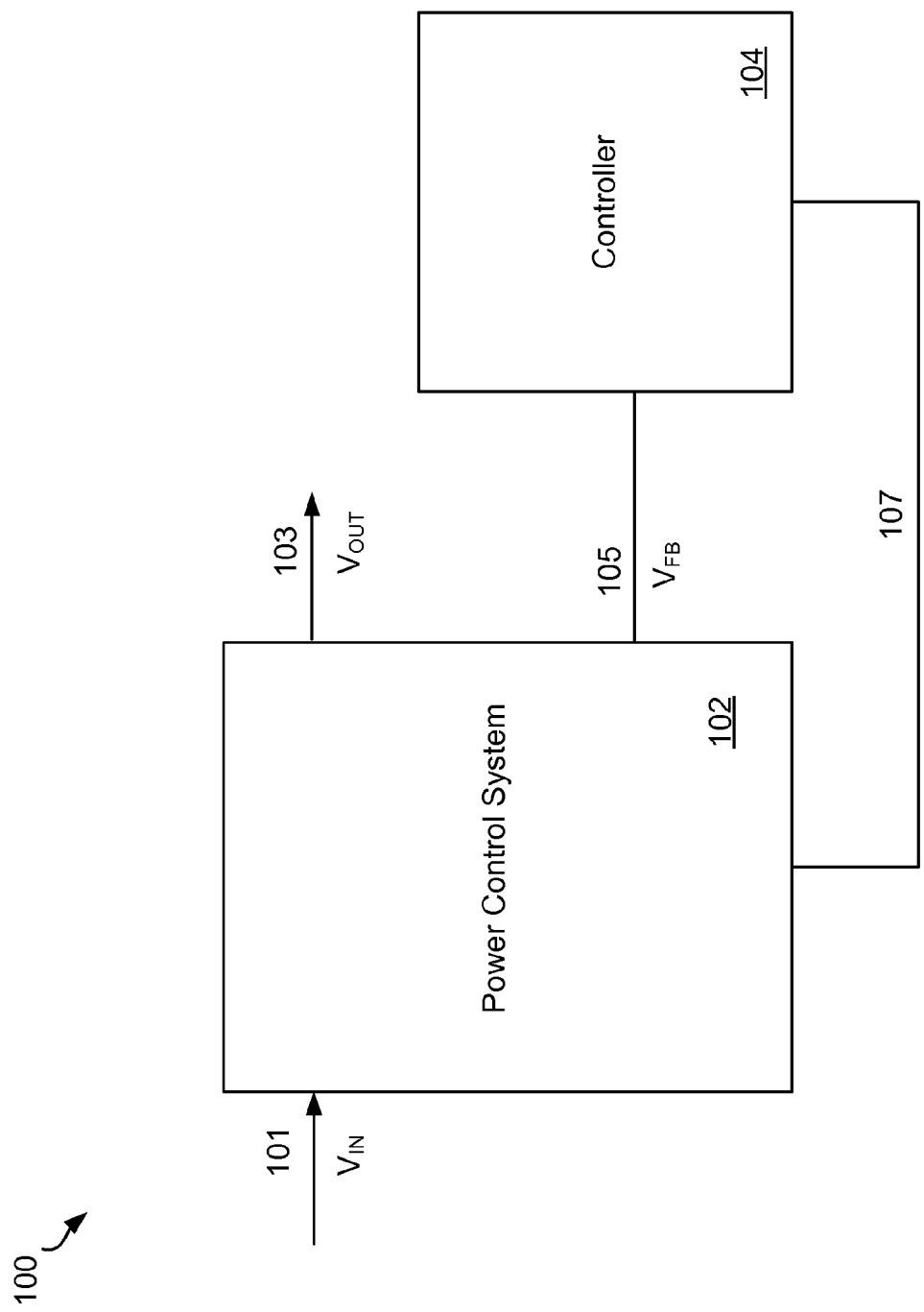

FAULT DETECTION

TECHNICAL FIELD

This disclosure relates generally to fault detection.

BACKGROUND

Power control systems can include circuits for fault detection. For example, a fault may occur when an output of a power control system is shorted to ground before use, which may damage the power control system during use. To detect a fault in the power control system, the power control system may wait for a feedback voltage in a feedback loop to reach a particular voltage value, e.g., 90% of a maximum voltage value, over a loop response time, and then compare the particular voltage value to a predetermined threshold voltage value, e.g., by using a comparator. If the particular voltage value is below the predetermined threshold voltage value, a fault is indicated in the power control system, and as a result, the power control system is turned off for fault protection.

SUMMARY

This specification describes fault detection in power control systems with controllers. In one aspect, a method includes measuring a plurality of values of a feedback voltage from a power control system over a period of time; determining a rate of feedback voltage change based on the measured values of the feedback voltage and a duration of the period of time; determining, with a controller, that the determined rate of feedback voltage change is smaller than the threshold rate of change; and in response to determining that the determined rate of feedback voltage change is smaller than the threshold rate of change, transmitting a fault indication signal to the power control system.

In another aspect, a controller is configured to perform operations including measuring a plurality of values of a feedback voltage from a power control system over a period of time; determining a rate of feedback voltage change based on the measured values of the feedback voltage and a duration of the period of time; determining, with a controller, that the determined rate of feedback voltage change is smaller than the threshold rate of change; and in response to determining that the determined rate of feedback voltage change is smaller than the threshold rate of change, transmitting a fault indication signal to the power control system.

In another aspect, one or more non-transitory storage media embody logic configured, when executed, to cause a controller to perform operations comprising measuring a plurality of values of a feedback voltage from a power control system over a period of time; determining a rate of feedback voltage change based on the measured values of the feedback voltage and a duration of the period of time; determining that the determined rate of feedback voltage change is smaller than the threshold rate of change; and in response to determining that the determined rate of feedback voltage change is smaller than the threshold rate of change, transmitting a fault indication signal to the power control system.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 1A is a block diagram of an example system including a power control system controlled by a controller.

DETAILED DESCRIPTION

System Overview

FIG. 1A is a block diagram of an example system 100 including a power control system 102 and a controller 104. The controller 104 is coupled to the power control system 102 and configured to perform fault detection for the power control system 102.

Figure 2A:
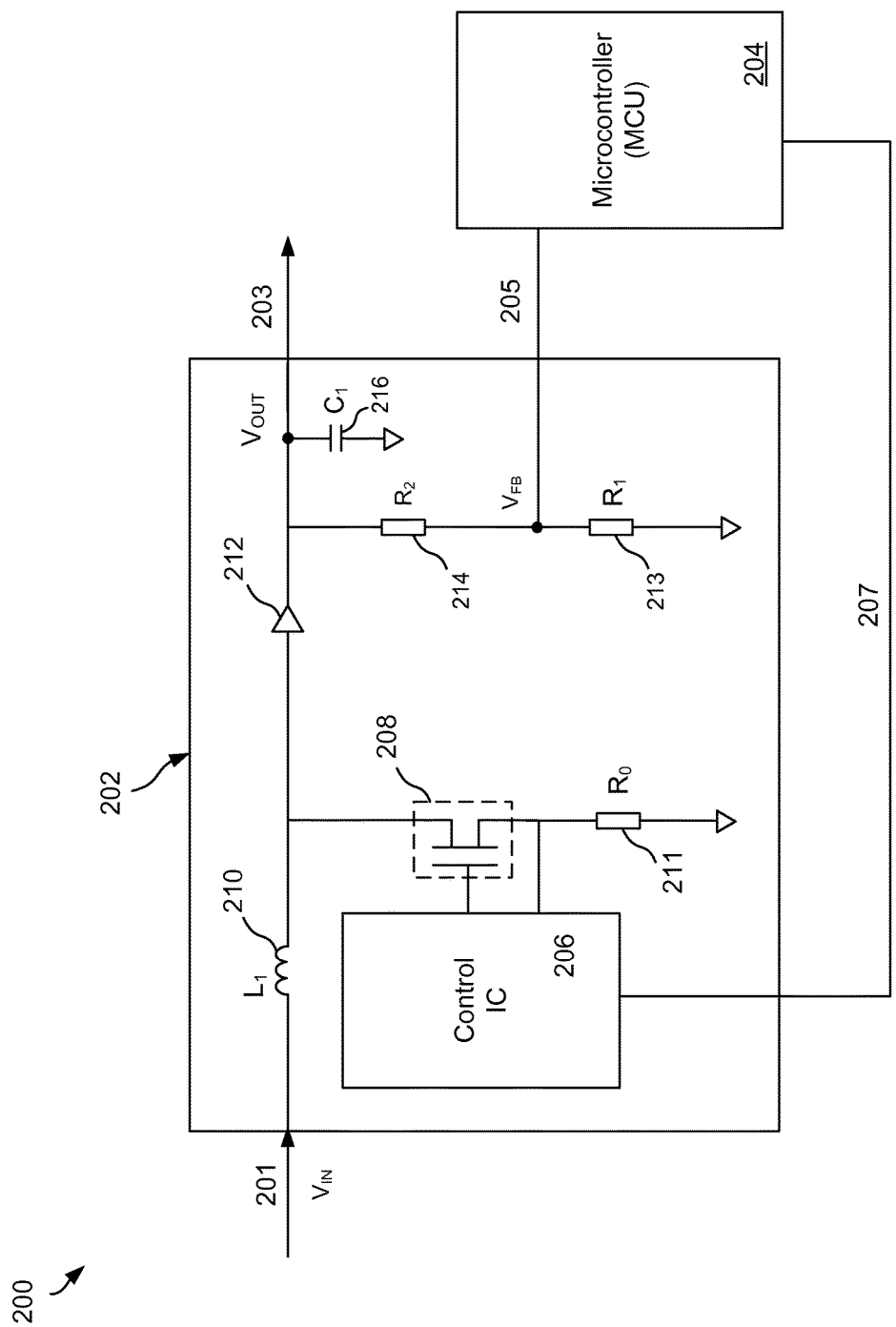
FIG. 2A is a diagram of a DC-to-DC power converter controlled by a microcontroller.
Figure 2B:
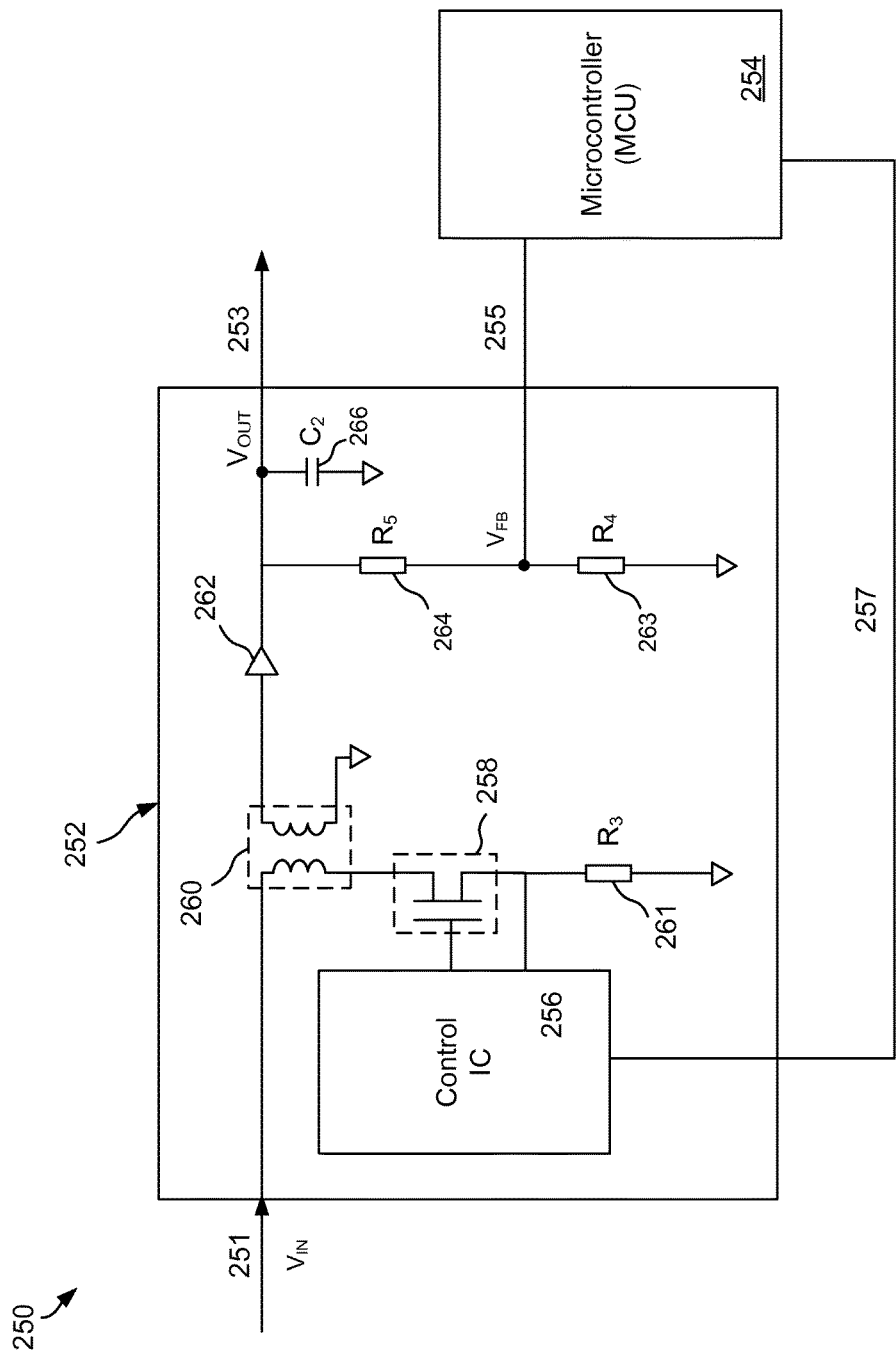
FIG. 2B is a diagram of an AC-to-DC power converter controlled by a microcontroller.

In some implementations, the power control system 102 includes a power converter for converting electrical energy from one to another, e.g., a DC-to-DC converter as illustrated in FIG. 2A or an AC-to-DC converter as illustrated in FIG. 2B. The power control system 102 may receive an input voltage 101 $V_{IN}$ and output an output voltage 103 $V_{OUT}$. The input voltage 101 $V_{IN}$ may be provided by a power system, e.g., a DC power supply including one or more of batteries, solar panels, rectifiers and DC generators, or an AC power supply.

A load may be coupled to the output of the power control system 102 to receive the output voltage 103 $V_{OUT}$. The output voltage 103 $V_{OUT}$ may provide a supply voltage to the load. Example loads may include electrical circuitry, e.g., lighting systems, charging and/or discharging circuitry, computing devices or systems, e.g., smart phones, tablets, TVs, or personal computers, automobile batteries, and any other suitable power-driven devices or systems.

When the power control system 102 is turned on, the power control system 102 may start to convert the input voltage $V_{IN}$ to the output voltage 103 $V_{OUT}$. In some examples, the power control system 102 includes an RLC circuit that includes a resistor, an inductor, and a capacitor connected in series or in parallel. The output voltage 103 $V_{OUT}$ may vary over a response time until reaching a stable value. For example, the output voltage 103 $V_{OUT}$ may be a ramping voltage, monotonically increasing to a maximum value over the response time. The response time may be associated with a time constant of the RLC circuit. In some cases, the maximum value of the output voltage 103 $V_{OUT}$ and the response time also depend on electrical characteristics of the coupled load and/or the input voltage 101 $V_{IN}$.

In some implementations, the system 100 includes a feedback loop. The feedback loop provides a feedback voltage 105 $V_{FB}$ to the controller 104. The feedback voltage 105 $V_{FB}$ may be associated with or correspond to the output voltage 103 $V_{OUT}$. As illustrated in FIGS. 2A-2B or in Equation (4), the feedback voltage 105 $V_{FB}$ may be proportional to the output voltage 103 $V_{OUT}$. Thus the feedback voltage 105 $V_{FB}$ may have similar properties to the output voltage 103 $V_{OUT}$.

Figure 1B:
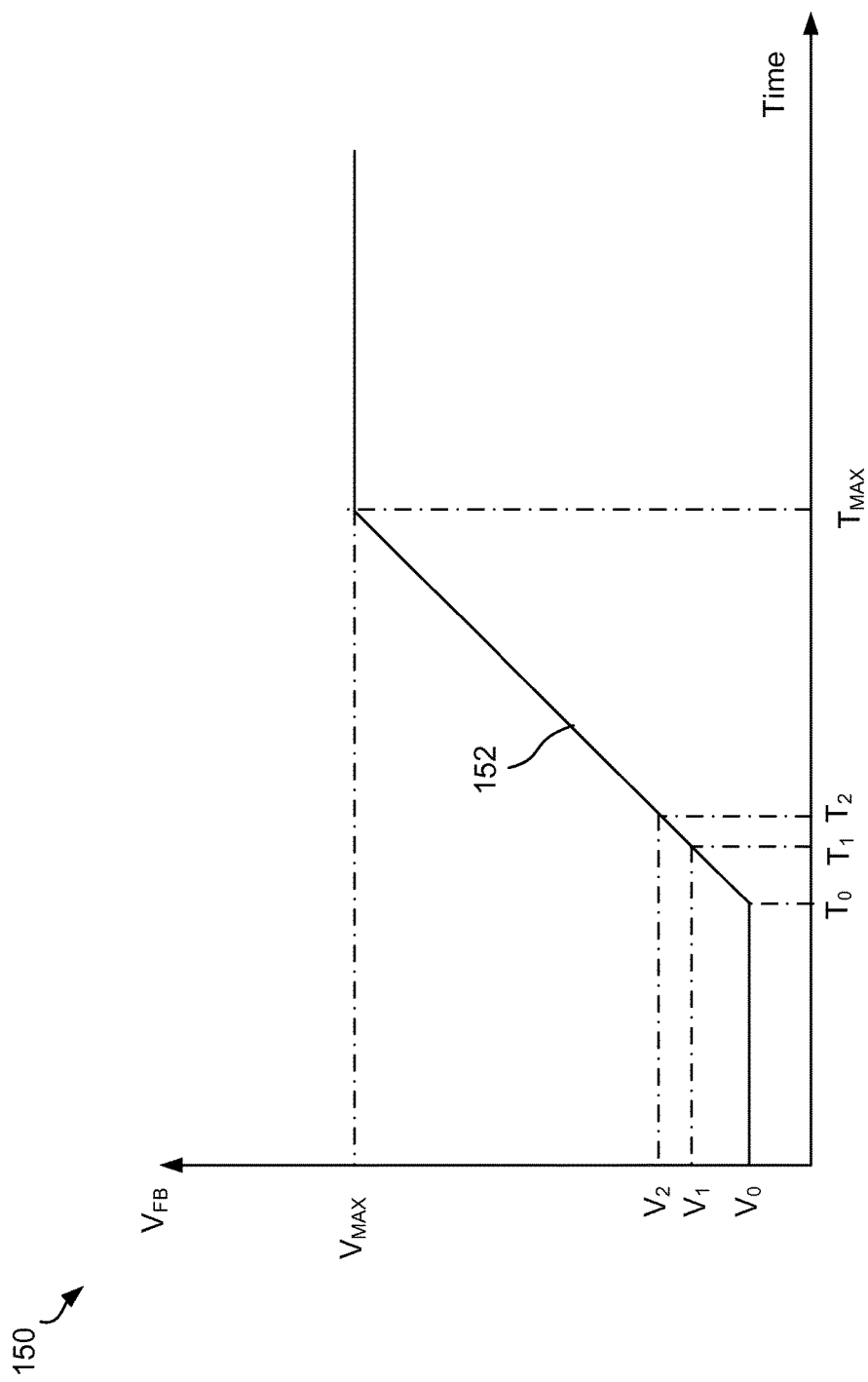
FIG. 1B is an example timing diagram of a feedback voltage in the power control system of FIG. 1A.

FIG. 1B is an example timing diagram 150 of the feedback voltage 105 $V_{FB}$ from the power control system 102. The feedback voltage 105 $V_{FB}$ varies over time along a curve 152, e.g., a monotonically increasing linear curve. When the power control system 102 is turned on at an initial time point $T_0$, the feedback voltage 105 $V_{FB}$ is $V_0$. At a first time point $T_1$ after the initial time point $T_0$, $V_{FB}$ increases to $V_1$. At a second time point $T_2$ after the first time point $T_1$, $V_{FB}$ increases from $V_1$ to $V_2$. Eventually the feedback voltage 105 $V_{FB}$ reaches a maximum and stable value $V_{MAX}$ at a maximum time point $T_{MAX}$.

A rate of feedback voltage change RATE may be calculated based on the varying curve 152. Suppose that the varying curve 152 is a linear curve. Then the rate of feedback voltage change RATE from $T_0$ to $T_{MAX}$ may be calculated to be:

$$\text{RATE} = (V_{MAX} - V_0)/(T_{MAX} - T_0) \quad (1).$$

The rate of feedback voltage change RATE may be also determined based on value changes of the feedback voltage during any period of time. For example, RATE may be determined based on $V_1$ and $V_2$ during the period of time from $T_1$ to $T_2$, as follows:

$$\text{RATE} = (V_2 - V_1)/(T_2 - T_1) \quad (2).$$

In another example, RATE may be determined based on $V_0$ and $V_1$ during the period of time from $T_0$ to $T_1$, as follows:

$$\text{RATE} = (V_1 - V_0)/(T_1 - T_0) \quad (3).$$

If the feedback voltage 105 $V_{FB}$ increases substantially linearly, that is, the varying curve 152 is a substantially linear curve, RATEs in Equations (1), (2), (3) may be substantially identical. In some cases, the feedback voltage 105 $V_{FB}$ increases nonlinearly, that is, the varying curve 152 is a nonlinear curve, the rate of feedback voltage change RATE may be locally determined based on the varying curve 152.

Referring back to FIG. 1A, the controller 104 is coupled to the power control system 102 through a connection 107, e.g., an on-chip interconnect. The controller 104 may be a microcontroller (MCU), a general microprocessor, an application specific integrated circuit (ASIC), a digital signal processor (DSP), a field programmable gate array, or various alternative circuitry configured to perform functions as further defined herein.

The controller 104 receives the feedback voltage 105 $V_{FB}$ from the power control system 102. The controller 104 may be programmed to monitor and measure values of the received feedback voltage 105 $V_{FB}$, e.g., at a sampling frequency. The controller 104 may determine whether a fault occurs in the power control system 102 based on the measured feedback voltage values during operation of the power control system 102.

In some implementations, the controller 104 determines a rate of feedback change based on measured values of the feedback voltage during a particular period of time. For example, the controller 104 may measure a first value of the feedback voltage at a first time point. After the particular period of time and at a second time point, the controller 104 measures a second value of the feedback voltage. The controller 104 then determines the rate of feedback voltage change by dividing a difference between the first and second values of the feedback voltage by the duration of the particular period of time, e.g., as shown in Equation 2.

After determining the rate of feedback voltage change during the particular period of time from the first time point to the second time point, the controller 104 may compare the determined rate of feedback voltage change to a threshold rate of change. The threshold rate of change may be predetermined and stored in the controller 114.

A user, e.g., an administrator, a programmer, or an engineer, of the system 100 may analyze properties of electrical circuitry, e.g., the RLC circuit as discussed above, in the power control system 102 and/or properties of a load circuit coupled to the power control system 102. The user may estimate a varying curve of the feedback voltage 105 $V_{FB}$, e.g., the varying curve 152 of FIG. 1B, based on the analyzed properties and/or formulas.

In some cases, the user determines that the varying curve is substantially linear. The user may determine an approximate maximum changed voltage value, e.g., $V_{MAX} - V_0$ and a response time, e.g., $T_{MAX} - T_0$, and estimate the threshold rate of change, e.g., $(V_{MAX} - V_0)/(T_{MAX} - T_0)$ as shown in Equation 1. The user may also define an acceptable margin for the threshold rate of change, e.g., less than 5%.

In some cases, the user determines that the varying curve is nonlinear. The user may locally determine the threshold rate of change based on the varying curve. For example, the user may determine the threshold rate of change during a particular period of time from the first time point, e.g., $T_1$ of FIG. 1B, to the second time point, e.g., $T_2$ of FIG. 1B, based on the varying curve.

During measurement, the controller 104 is programmed to measure the feedback voltage 105 $V_{FB}$ over the same particular period of time, that is, from the first time point to the second time point. The controller 104 may measure a first voltage value at the first time point and a second voltage value at the second time point, and calculate the rate of feedback voltage change based on the measured first and second values at the first and second time points, respectively. In some cases, the controller 104 measures a number of voltage values during the time period and calculates an average rate of feedback voltage change based on the number of voltage values. After determining the rate of feedback voltage change based on the measurement, the controller 104 compares the determined rate of feedback voltage change to the locally determined threshold rate of change for the same particular period of time.

In some cases, the controller 104 determines that the determined rate of feedback voltage change is larger than or substantially same as the threshold rate of change, e.g., with the margin of the threshold rate of change. The controller 104 may determine that no fault is indicated in the power control system 102. In such cases, the controller 104 continues measuring values of the feedback voltage for a next period of time, calculating the rate of feedback voltage change for the next period of time, and determining whether a fault is indicated as a result of comparing the rate of feedback voltage to the threshold rate of change.

In some cases, the controller 104 determines that the determined rate of feedback voltage change is smaller than the threshold rate of change, e.g., below the margin of the threshold rate of change. The controller 104 may determine that a fault is indicated in the power control system 102. In response to determining that the fault is indicated in the power control system 102, the controller 104 may transmit a fault indication signal to the power control system 102.

For early fault detection, the controller 104 may start monitoring the feedback voltage 105 $V_{FB}$ when the power control system is turned on at an initial time point to start converting the input voltage 101 $V_{IN}$ to the output voltage 103 $V_{OUT}$. That is, the controller 104 may measure a first value of the feedback voltage at a first time point substantially close to the initial time point or just at the initial time point.

The controller 104 may be programmed to measure the values of feedback voltage over a particular period of time T and calculate a rate of feedback voltage change. The particular period of time T may be substantially short than a response time for the feedback voltage 105 $V_{FB}$ reaching a stable level. For example, the power controller system 102 may include an RLC circuit that has a response time corresponding to a time constant of the RLC circuit. The particular period of time T may be substantially shorter than the response time, e.g., 1% of the response time. The controller 104 may be programmed to have a sampling frequency f larger than 1/T.

In a particular example, a user of the system 100 estimates that it takes the feedback voltage 105 $V_{FB}$ 100 µs to come up from 0 V to a maximum value 1 V. The user may estimate a threshold rate of change $RATE_{TH}$ to be 10 mV/µs. The controller 104 may be programmed to measure a rate of feedback voltage change every 1 µs, e.g., T=1%×100 µs, at a sampling frequency f>1 MHz, e.g., f=10 MHz.

The controller 104 may measure a first value $V_1$ at the first time point and a second value $V_2$ after 1 µs at the second time point, and determine that the rate of feedback voltage change is $(V_2-V_1)$/µs. If $V_2-V_1$<10 mV, then $(V_2-V_1)$/µs<$RATE_{TH}$, and the controller 104 determines a fault occurs in the power control system 102. If $V_2-V_1$>=10 mV, then $(V_2-V_1)$/µs>=$RATE_{TH}$, and the controller 104 determines that no fault occurs in the power control system 102.

In some cases, the power control system 102 converts a higher input voltage 101 $V_{IN}$ to a lower output voltage 103 $V_{OUT}$. The feedback voltage 105 $V_{FB}$ may experience a monotonically decreasing curve. In such cases, the controller 104 may compare absolute values of the determined rate of feedback voltage change and the threshold rate of change. If the absolute value of the determined rate of feedback voltage change is substantially same as or larger than the absolute value of the threshold rate of change, the controller 104 determines that no fault is indicated and continues to perform fault detection. If the absolute value of the determined rate of feedback voltage change is smaller than the absolute value of the threshold rate of change, the controller 104 determines that a fault is indicated.

The power control system 102 may include a control circuitry, e.g., a control integrated circuit (IC). The control circuitry is coupled to the controller 104, e.g., to form a feedback loop. The control circuitry is configured to receive the fault indication signal from the controller 104 and control to turn off the power control system 102 upon receiving the fault indication signal, preventing the power control system 102 from damage.

In some implementations, the power control system 102 includes a switch configured to turn the power control system on and off. The switch may include a metal-oxide-semiconductor field-effect transistor (MOSFET), an insulated-gate bipolar transistor (IGBT), or a bipolar junction transistor (BJT). The control circuitry controls the switch to turn on or off the power control system 102. For example, the control circuitry may control the switch to turn on the power control system 102 when receiving the input voltage 101 $V_{IN}$ and to turn off the power control system 102 when receiving the fault indication signal from the controller 104.

Particular embodiments of the subject matter described in this specification can be implemented so as to realize one or more of the following advantages. First, a controller can detect whether a fault occurs in a power control system without waiting for a long response time, e.g., at a very early stage of operation of the power control system. Second, the controller compares a rate of feedback voltage change to a predetermined threshold, instead of an absolute voltage value, which may increase detection flexibility and accuracy. Third, the controller can perform fault detection with different loads coupled to the power control system. Fourth, the controller enables effective fault detection thus protection for the power control system, which may prolong a lifetime of the power control system. Fifth, the controller can be used for or integrated in any suitable power-driven devices or systems, such as electrical circuitry, e.g., lighting systems, charging and/or discharging circuitry, or analog converters, computing devices or systems, e.g., smart phones, tablets, TVs, or personal computers, or automobile battery systems, e.g., batteries in hybrid cars.

Example Power Control Systems

FIG. 2A shows an example system 200 including a DC-to-DC power converter 202 coupled to a microcontroller (MCU) 204. The MCU 204 is configured to determine whether a fault has occurred in the DC-to-DC power converter 202. The system 200, the power DC-to-DC converter 202, and the MCU 204 are examples of the system 100, the power control system 102, and the controller 104 of FIG. 1A, respectively.

The DC-to-DC power converter 202 receives an input voltage 201 $V_{IN}$, e.g., from a DC power source such as batteries, solar panels, rectifiers and DC generators, and outputs an output voltage 203 $V_{OUT}$. In some examples, the DC-to-DC power converter 202 is a boost converter or a step-up converter with an output voltage $V_{OUT}$ greater than the input voltage $V_{IN}$.

The DC-to-DC power converter 202 includes one or more energy storage elements, e.g., an inductor 210 $L_1$ and a capacitor 216 $C_1$. The capacitor 216 $C_1$ is coupled to the output of the power converter 202, e.g., also for being a filter to reduce a ripple of the output voltage 203 $V_{OUT}$. The capacitor 216 $C_1$ may be grounded. A diode 212 is coupled between the inductor 210 $L_1$ and the capacitor 216 $C_1$.

The DC-to-DC power converter 202 includes a control IC 206 and a transistor 208. The transistor 208 acts as a switch in operation of the power converter 202. The transistor 208 may be a metal-oxide-semiconductor field-effect transistor (MOSFET), an insulated-gate bipolar transistor (IGBT), or a bipolar junction transistor (BJT). A drain node of the transistor 208 is coupled between the inductor 210 and the diode 212. A source node of the transistor 208 is coupled to a ground through a resistor 211 $R_0$. The control IC 206 is coupled to a gate node of the transistor 208. The control IC 206 controls the transistor 208 to turn on and off the power converter 202.

A series of resistors 213 $R_1$ and 214 $R_2$ are coupled to the output 203 of the power converter 202. The resistor 214 $R_2$ is coupled between the diode 212 and the output 203, having a voltage identical to $V_{OUT}$, and the resistor 213 $R_1$ is grounded. The power converter 202 includes a feedback node 205 between the resistor 213 $R_1$ and the resistor 214 $R_2$ for providing a feedback voltage $V_{FB}$. The feedback voltage 205 $V_{FB}$ is associated with the output voltage 204 $V_{OUT}$ as follows:

$$V_{FB}=V_{OUT}\times R_1/(R_1+R_2) \tag{4}$$

In some cases, a fault occurs when the feedback node 205 is shorted to the ground, e.g., $V_{FB}$=0. In some cases, a fault occurs when the output 203 is shorted to the ground, e.g., $V_{OUT}$=0, when the power converter 202 is in a factory. In some cases, a fault occurs when the output voltage 203 $V_{OUT}$ is stuck at a certain voltage level, e.g., when the output 203 is overloaded with a load coupled to the output 203 such that the output voltage 203 goes up to the certain voltage level and does not go up or down. If the fault occurs in the power converter 202, the transistor 208 may keep turning on or experience a large current. Eventually the transistor 208 may burn into fire and the power converter 202 may be damaged.

To detect and prevent faults in the DC-to-DC power converter 202, the system 200 includes a feedback loop with the MCU 204 coupled to the power converter 202. The MCU 204 may be coupled to the feedback node 205 to receive the feedback voltage 205 $V_{FB}$ and coupled back to the control IC 206 via a connection 207, e.g., an on-chip interconnect. The MCU 204 monitors the feedback voltage 205 $V_{FB}$ and determines whether a fault occurs in the power converter 202.

The MCU 204 may include a memory to store a threshold rate of change for the feedback voltage of the power converter 202. As noted above, the threshold rate of change may be determined based on properties of the power converter 202 and/or properties of a load coupled to the power converter 202. A varying curve of the feedback voltage 205 $V_{FB}$ over a response time may be also determined or estimated based on the properties.

For example, the power converter 202 includes an RLC circuit including the inductor 210 $L_1$, inductor capacitor 216 $C_1$, the resistor 212 $R_1$ and the resistor 214 $R_2$. A maximum value of the feedback voltage 205 $V_{FB}$ and a response time of the power converter 202 may be related to a time constant of the RLC circuit. A particular period of time for the MCU 204 to determine a rate of feedback voltage change during measurement may be also determined, e.g., based on the response time, and stored in the MCU 204. The particular period of time is substantially smaller than the response time. A sample frequency may be also determined, e.g., based on the determined particular period of time, and stored in the MCU 204.

In operation, when the power converter 202 is turned on, e.g., by the control IC 206, the MCU 204 starts to monitor the feedback voltage 205 $V_{FB}$ and measure a number of values of the feedback voltage 205 $V_{FB}$ over the stored particular period of time at the stored sampling frequency. Based on the measured feedback voltage values and the duration of the particular period of time, the MCU 204 determines a rate of feedback voltage change and compares the determined rate of feedback voltage change to the stored threshold rate of change.

If the MCU 204 determines that the determined rate of feedback voltage change is substantially same as or larger than the stored threshold rate of change, the MCU 204 continues to measure values of the feedback voltage and checks whether a fault is indicated. If the MCU 204 determines that the determined rate of feedback voltage change is smaller than the stored threshold rate of change, the MUC determines that a fault is indicated, and transmits a fault indication signal to the control IC 206. Upon receiving the fault indication signal, the control IC 206 takes action to protect the power converter 202, e.g., disabling the transistor 208 to turn off the power converter 202.

FIG. 2B shows another example system 250 including an AC-to-DC power converter 252 controlled by a microcontroller (MCU) 254. The AC-to-DC power converter 252 converts an input AC voltage 251 $V_{IN}$, e.g., from an AC power supply, into an output DC voltage 253 $V_{OUT}$. The MCU 254, e.g., the MCU 204 of FIG. 2A, is configured to perform effective fault detection for the AC-to-DC power converter 252.

The configuration of the AC-to-DC power converter 252 is similar to the configuration of the DC-to-DC power converter 202 of FIG. 2A, except that the AC-to-DC power converter 252 includes a transformer 260 instead of the inductor 210 $L_1$ of FIG. 2B. The transformer 260 converts the input AC voltage 251 to a DC voltage and is connected to a transistor 258, e.g., the transistor 208 of FIG. 2A and a diode 262.

A control IC 256, e.g., the control IC 206 of FIG. 2A, is coupled to the transistor 258 for controlling the transistor 258 to turn on and off. The transistor 258 is connected to a resistor 261 $R_3$ that is grounded. A series of resistors 263 $R_4$ and 264 $R_5$ are coupled to the output 253 of the power converter 252. The resistor 264 $R_5$ is coupled between the diode 262 and the output 253, having a voltage identical to $V_{OUT}$, and the resistor 263 $R_4$ is grounded. The power converter 252 includes a feedback node 255 between the resistor 263 $R_4$ and the resistor 264 $R_5$ for providing a feedback voltage $V_{FB}$.

To detect and prevent faults in the AC-to-DC power converter 252, the system 250 includes a feedback loop with the MCU 254 coupled to the power converter 252. The MCU 254 may be coupled to the feedback node 255 to receive the feedback voltage 255 $V_{FB}$ and coupled back to the control IC 256 via a connection 257, e.g., an on-chip interconnect. The MCU 254 monitors the feedback voltage 255 $V_{FB}$ and determines whether a fault occurs in the power converter 252 by comparing a measured rate of feedback voltage change to a stored threshold rate of change, as discussed above for MCU 204 in FIG. 2A. When a fault occurs, the MCU 254 transmits a fault indication signal to the control IC 256, and the control IC 256 controls to disenable the transistor 258 to turn off the power converter 252.

Example Flowchart

Figure 3:
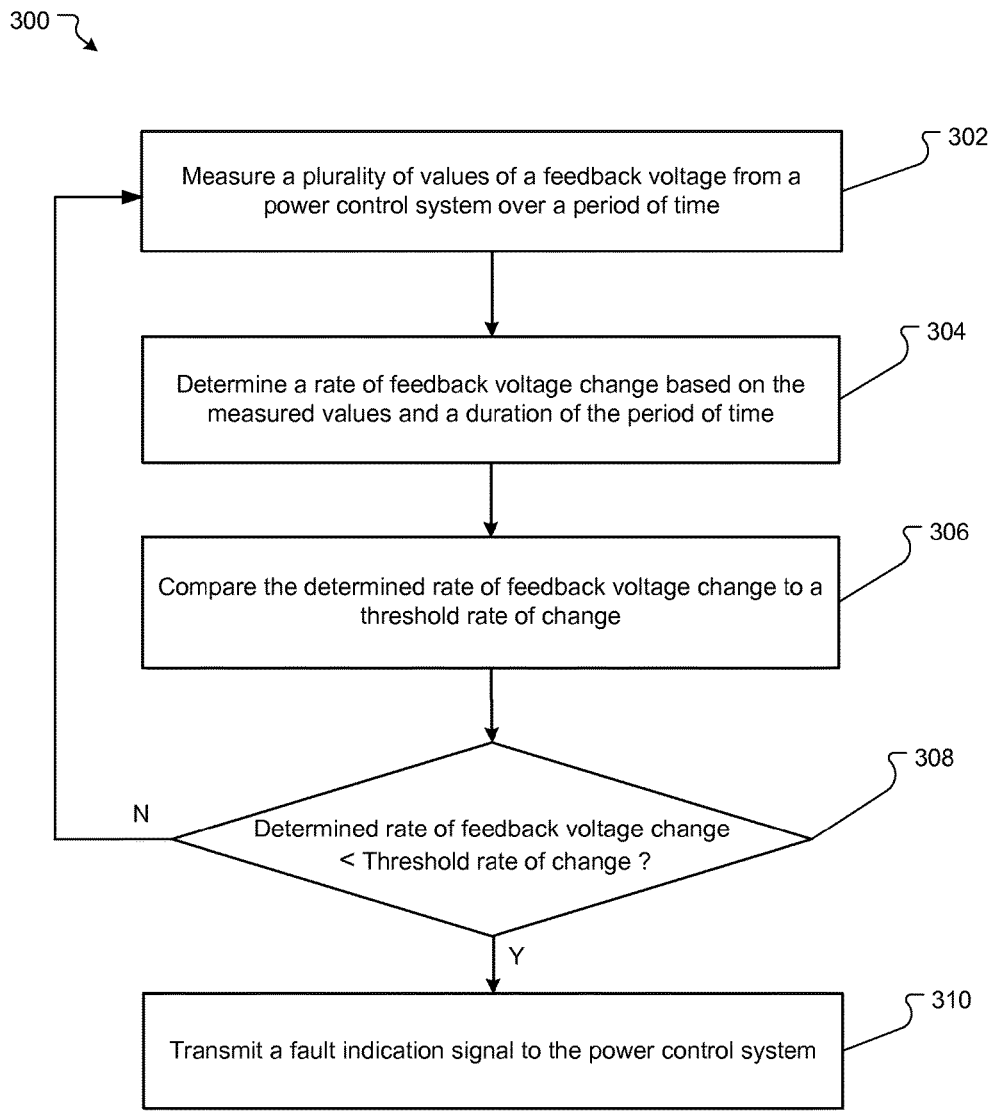
FIG. 3 is a flow diagram of an example process performed by the controller of FIG. 1A, FIG. 2A, or FIG. 2B.

FIG. 3 is a flow diagram of an example process 300 performed by a controller, e.g., the controller 104 of FIG. 1A, the microcontroller 204 of FIG. 2A, or the microcontroller 254 of FIG. 2B. The converter performs fault detection for a power control system, e.g., the power control system 102 of FIG. 1A, the DC-to-DC power converter 202 of FIG. 2A, or the AC-to-DC power converter 252 of FIG. 2B.

The controller measures a plurality of values of a feedback voltage from the power control system over a period of time (302). The controller may start to monitor the feedback voltage when the power control system is turned on at an initial time point. A beginning time point of the period of time may be substantially close to the initial time point, such that the controller may determines a fault in the power control system at a very early stage of operating the power control system.

The period of time may be predetermined based on properties of the power control system and/or properties of a load coupled to the power control system, e.g., by a user of the power control system. The user may estimate a response time for the feedback voltage reaching a stable level, e.g., a maximum value, and determine the period of time to be substantially shorter than the response time. The period of time may be stored in the controller. A sampling frequency of the controller may be also determined, e.g., based on the period of time, and stored in the controller.

The controller determines a rate of feedback voltage change based on the measured values and a duration of the period of time (304). In some cases, the controller measures a first value of the feedback voltage at a first time point. After the period of time and at a second time point, the controller measures a second value of the feedback voltage. The controller calculates the rate of feedback voltage change by dividing a difference between the first and second values by the duration of the period of time. In some cases, the controller measures the plurality of values and calculates an average rate of feedback voltage change for the period of time.

The controller compares the determined rate of feedback voltage change to a threshold rate of change (306). As noted above, the user may estimate a varying curve for the feedback voltage based on the properties of the power control system and/or the load coupled to the power control system. The user may estimate the threshold rate of change based on the maximum value of the feedback voltage and the response time. In some examples, the user also determines a margin for the threshold rate of change. The estimated threshold rate of change and/or the margin may be stored in the controller before use.

The controller determines whether the determined rate of feedback voltage change is smaller than the stored threshold rate of change (308). If the determined rate of feedback voltage change is not smaller than, e.g., substantially same as or larger than, the stored threshold rate of change, the controller determines that no fault occurs and continues to perform fault detection, that is, the process 300 turns back to step 302.

If the determined rate of feedback voltage change is smaller than the stored threshold rate of change, the controller determines that a fault occurs. The controller transmits a fault indication signal to the power control system (310).

In some implementations, the power control system includes a control circuitry, e.g., the control IC 206 of FIG. 2A or the control IC 256 of FIG. 2B. The control circuitry receives the fault indication signal and controls to turn off the power control system for fault protection. The power control system may include a switch, e.g., the transistor 208 of FIG. 2A or the transistor 258 of FIG. 2B. The control circuitry may control the switch, e.g., by disabling the switch, to turn off the power control system to protect the power control system.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, microcontrollers or general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. For example, the subject matter is described in context of scientific papers. The subject matter can apply to other indexed work that adds depth aspect to a search. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

What is claimed is:

1. A method comprising:
   measuring, by a controller, a plurality of values of a feedback voltage from a power control system over a period of time, the power control system being configured to provide an output voltage, the feedback voltage being associated with the output voltage, a response time being estimated for the feedback voltage varying from an initial lower voltage to a higher voltage at a stable level based on one or more properties of the power control system, the period of time being predetermined based on the estimated response time;
   determining, by the controller, a rate of feedback voltage change based on the measured values of the feedback voltage and a duration of the period of time;
   determining, by the controller, that the determined rate of feedback voltage change is smaller than a threshold rate of change; and
   in response to determining that the determined rate of feedback voltage change is smaller than the threshold rate of change, transmitting, by the controller, a fault indication signal to the power control system.

2. The method of claim 1, further comprising determining that the power control system is turned on at an initial time point,
   wherein measuring a plurality of values of a feedback voltage over a period of time comprises:
      measuring a first value of the feedback voltage at a first time point substantially close to the initial time point; and
      after the period of time and at a second time point, measuring a second value of the feedback voltage.

3. The method of claim 2, wherein determining a rate of feedback voltage change comprises calculating the rate of feedback voltage change by dividing a difference between the first and second values of the feedback voltage by the duration of the period of time.

4. The method of claim 1, wherein the power control system includes a switch and a control integrated circuit (IC), the control IC being configured to control the switch to turn on or off the power control system.

5. The method of claim 4, wherein the control IC is configured to receive the fault indication signal and to control the switch to turn off the power control system upon receiving the fault indication signal.

6. The method of claim 4, wherein the switch includes a metal-oxide-semiconductor field-effect transistor (MOSFET), an insulated-gate bipolar transistor (IGBT), or a bipolar junction transistor (BJT).

7. The method of claim 1, wherein the power control system includes an RLC circuit, and wherein the period of time is predetermined based on a response time of the RLC circuit, the period of time being substantially shorter than the response time of the RLC circuit.

8. The method of claim 7, wherein the period of time is about one percent of the response time of the RLC circuit.

9. The method of claim 7, wherein the threshold rate of change is predetermined based on electrical characteristics of the RLC circuit.

10. The method of claim 1, wherein the power control system includes a DC-to-DC power converter or an AC-to-DC power converter.

11. A controller coupled to a power control system and configured to perform operations including:
measuring a plurality of values of a feedback voltage from the power control system over a period of time, the power control system being configured to provide an output voltage, the feedback voltage being associated with the output voltage, a response time being estimated for the feedback voltage varying from an initial lower voltage to a higher voltage at a stable level based on one or more properties of the power control system, the period of time being predetermined based on the estimated response time;
determining a rate of feedback voltage change based on the measured values of the feedback voltage and a duration of the period of time;
determining that the determined rate of feedback voltage change is smaller than a threshold rate of change; and
in response to determining that the determined rate of feedback voltage change is smaller than the threshold rate of change, transmitting a fault indication signal to the power control system.

12. The controller of claim 11, the operations comprising determining that the power control system is turned on at an initial time point,
wherein measuring a plurality of values of a feedback voltage over a period of time comprises:
measuring a first value of the feedback voltage at a first time point substantially close to the initial time point; and
after the period of time and at a second time point, measuring a second value of the feedback voltage.

13. The controller of claim 12, wherein determining a rate of feedback voltage change comprises calculating the rate of feedback voltage change by dividing a difference between the first and second values of the feedback voltage by the duration of the period of time.

14. The controller of claim 11, wherein the power control system includes a switch and a control integrated circuit (IC), the control IC being configured to control the switch to turn on or off the power control system.

15. The controller of claim 14, wherein the control IC is configured to receive the fault indication signal and to control the switch to turn off the power control system upon receiving the fault indication signal.

16. The controller of claim 14, wherein the switch includes a metal-oxide-semiconductor field-effect transistor (MOSFET), an insulated-gate bipolar transistor (IGBT), or a bipolar junction transistor (BJT).

17. The controller of claim 11, wherein the power control system includes an RLC circuit, and wherein the period of time is predetermined based on a response time of the RLC circuit, the period of time being substantially shorter than the response time of the RLC circuit.

18. The controller of claim 17, wherein the period of time is about one percent of the response time of the RLC circuit.

19. The controller of claim 17, wherein the threshold rate of change is predetermined based on electrical characteristics of the RLC circuit.

20. One or more non-transitory storage media embodying logic configured when executed to cause a controller to perform operations comprising:
measuring a plurality of values of a feedback voltage from a power control system over a period of time, the power control system being configured to provide an output voltage, the feedback voltage being associated with the output, a response time being estimated for the feedback voltage varying from an initial lower voltage to a higher voltage at a stable level based on one or more properties of the power control system, the period of time being predetermined based on the estimated response time;
determining a rate of feedback voltage change based on the measured values of the feedback voltage and the predetermined duration of the period of time;
determining that the determined rate of feedback voltage change is smaller than a threshold rate of change; and
in response to determining that the determined rate of feedback voltage change is smaller than the threshold rate of change, transmitting a fault indication signal to the power control system.

21. The method of claim 1, wherein the duration of the period of time is substantially smaller than the estimation of the response time.

22. The method of claim 1, wherein the power control system is configured to provide the output voltage to a load circuit, and
wherein the estimation of the response time is determined based on the one or more properties of the power control system and one or more properties of the load circuit.

23. The method of claim 22, wherein the threshold rate of change is predetermined based on the one or more properties of the power control system and the one or more properties of the load circuit.

24. The method of claim 1, wherein measuring the plurality of values of the feedback voltage over the period of time comprises:
measuring, by the controller, the plurality of values of the feedback voltage over the period of time at a sampling frequency, wherein the sampling frequency is predetermined based on the predetermined period of time.

25. The method of claim 24, wherein the predetermined period of time and the predetermined sampling frequency are stored in the controller.

26. The method of claim 1, wherein a varying curve is estimated for the feedback voltage to vary from the initial lower voltage to the higher voltage at the stable level over the response time.

27. The method of claim 26, wherein the varying curve comprises a monotonically increasing curve.

* * * * *